(12) United States Patent
Shimizu et al.

(10) Patent No.: US 7,222,060 B2
(45) Date of Patent: May 22, 2007

(54) CIRCUIT SIMULATION APPARATUS INCORPORATING DIFFUSION LENGTH DEPENDENCE OF TRANSISTORS AND METHOD FOR CREATING TRANSISTOR MODEL

(75) Inventors: Takashi Shimizu, Kanagawa (JP); Hironori Sakamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 587 days.

(21) Appl. No.: 10/668,974

(22) Filed: Sep. 24, 2003

(65) Prior Publication Data

US 2004/0059559 A1    Mar. 25, 2004

(30) Foreign Application Priority Data

Sep. 25, 2002    (JP)    ............................. 2002-279398

(51) Int. Cl.
    *G06F 17/50*    (2006.01)
(52) U.S. Cl. .............................. 703/14; 257/499; 716/4
(58) Field of Classification Search .................... 703/14
    See application file for complete search history.

(56) References Cited

U.S. PATENT DOCUMENTS

| 5,648,920 | A | 7/1997 | Duvvury et al. | |
| 6,314,390 | B1 * | 11/2001 | Bittner et al. | .................. 703/14 |
| 6,618,837 | B1 * | 9/2003 | Zhang et al. | .................... 716/4 |
| 6,649,429 | B2 * | 11/2003 | Adams et al. | ................. 438/14 |
| 6,909,976 | B2 * | 6/2005 | Kitamaru et al. | ............. 702/64 |

FOREIGN PATENT DOCUMENTS

| JP | 2000-322456 | 11/2000 |
| JP | 2001-035930 | 2/2001 |

OTHER PUBLICATIONS

Chung et al, "An Analytical Threshold-Voltage Model of Trench-Isolated MOS Devices with Nonuniformly Doped Substrates", IEEE Transactions on Electron Devices, vol.39, No. 3, Mar. 1992.*
Lin et al, "A Closed-Form Back-Gate-Bias Related Inverse Narrow-Channel Effect Model for Seep-Submicron VLSI CMOS Devices Using Shallow Trench Isolation", IEEE Transactions on Electron Devices, vol. 47, No. 4, Apr. 2000.*

(Continued)

*Primary Examiner*—Paul Rodriguez
*Assistant Examiner*—Mary C Jacob
(74) *Attorney, Agent, or Firm*—Foley & Lardner LLP

(57) ABSTRACT

From the data of diffusion-length-dependent parameters extracted from the parameters of the transistor model of MOS transistors and from the parameters of transistors having various diffusion lengths, a diffusion-length-dependent parameter correcting unit creates approximate expressions of the diffusion length dependence of these parameters, and calculates parameter correction values to be used instead of original parameter values by using the created approximate expressions. Hence, the correction values can be used easily instead of the original parameter values, whereby a transistor model of MOS transistors having a different diffusion length DL can be created easily. Circuit simulation in consideration of the diffusion length dependence of the drain currents of MOS transistors can thus be carried out, whereby highly accurate simulation can be attained.

12 Claims, 7 Drawing Sheets

OTHER PUBLICATIONS

Bianchi et al, "Accurate Modeling of Trench Isolation Induced Mechanical Stress Effects on MOSFET Electrical Performance", International Electron Devices Meeting, IDEM '02, Digest, pp. 117-120, Dec. 8-11, 2002.*

Yamaguchi, Ken, "Field Dependent Mobility Model for Two-Dimensional Numerical Analysis of MOSFET's", IEEE Transactions on Electron Devices, vol. ED-26, No. 7, Jul. 1979.*

Chu et al, "A Database-Driven VLSI Design System", IEEE Transactions on Computer-Aided Design, vol. CAD-5, No. 1, Jan. 1986.*

Aggarwal et al, "A Methodology for Pre-Determination of Bipolar SPICE Model Parameters in BICMOS Technology", Proceedings of IEEE International Conference on Microelectronic Test Structures, vol. 6, Mar. 1993.*

G. Scott et al., "NMOS Drive Current Reduction Caused by Transistor Layout and Trench Isolation Induced Stress," IEDM Technical Digest, U.S.A., IEEE (1999) pp. 827-830.

* cited by examiner

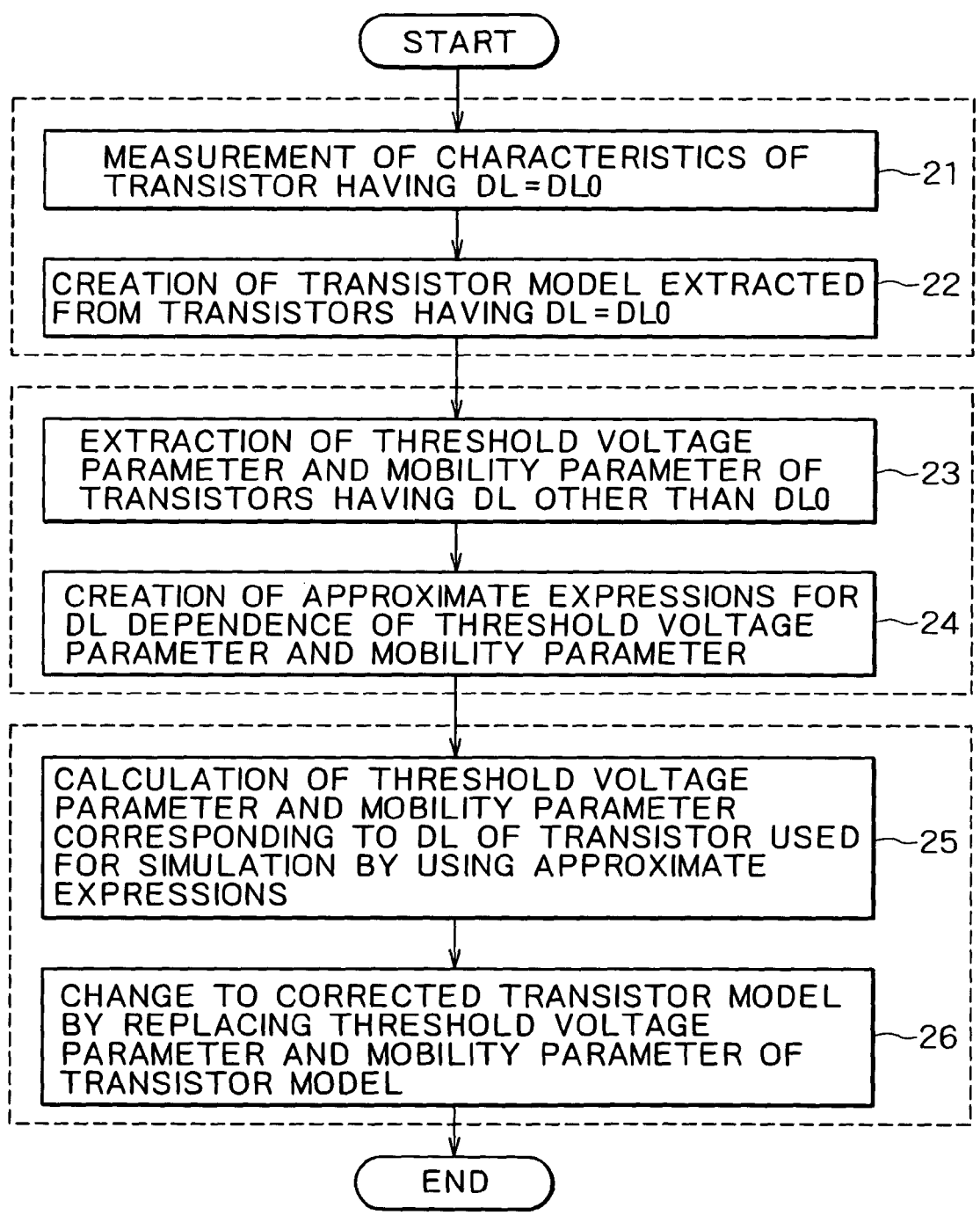

DL0

DL1

DL2

CIRCUIT SIMULATION APPARATUS INCORPORATING DIFFUSION LENGTH DEPENDENCE OF TRANSISTORS AND METHOD FOR CREATING TRANSISTOR MODEL

BACKGROUND OF THE INVENTION

1. Field of the Invention

The present invention relates to improvement in circuit simulation accuracy and, more particularly, to a circuit simulation apparatus incorporating diffusion length dependence of MOS transistors, having not been considered so far, and to a method for creating a transistor model.

2. Description of the Related Art

As MOS transistors are being miniaturized in the development of semiconductors, simulation accuracy of a circuit simulator typified by SPICE is requested to be improved further.

FIG. 1 is a block diagram showing the configuration of a conventional circuit simulation apparatus. A simulation executing unit 1 is the main body of the simulator typified by SPICE and is actually a simulation executing program running on a computer. The simulation executing unit 1 reads a circuit net list 3 in which the connection descriptions of a circuit to be simulated are stored and calculates changes in the current and voltage of the circuit to be simulated, by referring to a transistor model 2 of MOS transistors.

For higher simulation accuracy, a transistor model is absolutely required to have higher accuracy. For higher accuracy of the transistor model, methods for extracting model parameters, such as threshold voltage, narrow-channel effect coefficient, short-channel effect coefficient, mobility and carrier speed saturation voltage, have been improved (for example, refer to FIG. 1 in Japanese Unexamined Patent Publication No. 2001-035930).

In addition, in creation of the BSIM3 and BSIM4 transistor models being famous as SPICE transistor models, in the case when device conditions are modified, a method for creating a transistor model in a short time by modifying extracted parameters into parameters corresponding to the changed conditions has been disclosed (for example, refer to FIG. 1 in Japanese Unexamined Patent Publication No. 2000-322456).

"However, in recent years, it has been pointed out by Gregory Scott et al. that the drain current of a MOS transistor changes depending on the diffusion length DL thereof, and this has attracted attention as a new factor for lowering simulation accuracy ("NMOS Drive Current Reduction Caused by Transistor Layout and Trench Isolation Induced Stress" by Gregory Scott et al, IEDM Technical Digest, U.S.A., IEEE, 1999, IEDM-99, p. 827–830). In the case of transistors based on isolation technology, such as STI (Shallow Trench Isolation), as the isolation between transistors becomes finer, it is assumed that the mobility in the channel region under the gate electrode changes under the influence of crystal strain induced in the diffusion layer and the channel region owing to the existence of the isolation regions in the circumference, thereby resulting in the change in drain current."

FIG. 2A is a plan view of an N-channel MOS transistor, and FIG. 2B is a sectional view taken along line II—II of FIG. 2A. As shown in FIG. 2A, the diffusion length DL designates the length of a field pattern 31 representing the diffusion layer and the boundary between the channel formation region and the isolation region by STI in a direction perpendicular to a gate electrode 32. The length corresponds to the total length of the source length, channel length and drain length. In FIG. 2B, numeral 41 designates a silicon substrate, numeral 42 designates a P-type well, numeral 43 designates an N-type source-drain region, numeral 44 designates an N-type LDD (Lightly Doped Drain) region, numeral 45 designates a gate insulating film, numeral 46 designates a gate electrode, numeral 47 designates an STI region, and numeral 48 designates an insulating film. The STI region 47 is formed by filling a trench dug into the surface of the silicon substrate 41 with insulating material and makes contact with the N-type source-drain region. In FIGS. 2A and 2B, an N-channel MOS transistor is shown. A P-channel MOS transistor has a similar structure that is obtained only when an N-type impurity is replaced with a P-type impurity.

However, the dependence of the drain current on the diffusion length DL is not incorporated in the transistor model 2, such as the BSIM3 and BSIM4 transistor models, for use in the present circuit simulation apparatus. In other words, as shown in FIG. 3 by the diffusion length dependence of the drain current of the N-channel MOS transistor, when the diffusion length DL is small, the measurement value (black dot) of the drain current ID is small. However, in the present MOS transistor model, as indicated by the straight line L0, the value of the drain current ID is constant which is obtained when the diffusion length of the transistor used for model parameter extraction is DL0. Hence, in the present circuit simulation apparatus typified by SPICE, simulation is carried out regardless of the presence of the DL dependence. This is a factor that impairs improvement in simulation accuracy.

Even in the case when the present circuit simulation apparatus not incorporating the diffusion length dependence is used, by creating many kinds of transistor models through parameter extraction for individual MOS transistors having different diffusion lengths DL beforehand, by selecting a transistor model having diffusion length DL and used for a circuit to be simulated from among the many kinds of models, and by using the selected transistor model, the accuracy of the simulation can be improved. However, since many kinds of transistor models having different diffusion lengths DL are created, a long time is required for parameter extraction and parameter fitting. In addition, MOS transistor models must be used selectively depending on the diffusion length DL during simulation. This proves complicated and human errors are apt to occur.

SUMMARY OF THE INVENTION

It is an object of the present invention to provide a circuit simulation apparatus having a unit which can easily creating a MOS transistor model for a wide range of diffusion lengths DL in a short time on the basis of a MOS transistor model whose parameters are subjected to fitting with respect to a specific diffusion length DL, and to provide a method for creating a MOS transistor model having various diffusion lengths DL in the circuit simulation apparatus.

A circuit simulation apparatus according to a first aspect of the present invention comprises a simulation executing unit which reads a circuit net list in which the connection descriptions of a circuit to be simulated are stored and which calculates the changes in the current and voltage of the circuit to be simulated, by referring to a transistor model; and diffusion-length-dependent parameter correcting unit which creates a corrected approximate expression regarding a diffusion-length-dependent parameter whose values change depending on the diffusion length for a transistor model created on the basis of transistors having a predetermined diffusion length and which calculates the correction value of the diffusion-length-dependent parameter for a transistor model having a diffusion length different from that of the above-mentioned transistor model by using the above-mentioned approximate expression.

A transistor model creating method according to a second aspect of the invention comprises the steps of creating a transistor model on the basis of the characteristics of a MOS transistor having a predetermined diffusion length; extracting diffusion-length-dependent parameters for each of a plurality of MOS transistors having diffusion lengths different from the predetermined diffusion length and creating approximate expressions representing the diffusion length dependence of the diffusion-length-dependent parameters; and calculating the correction values of the diffusion-length-dependent parameters of a transistor used for simulation by the above-mentioned approximate expressions and using the correction values instead of the diffusion-length-dependent parameter values of the transistor model on the basis of the characteristics of the MOS transistor having the predetermined diffusion length.

BRIEF DESCRIPTION OF THE DRAWINGS

FIG. 5 is a flowchart for a transistor model creating method in accordance with the present invention;

THE PREFERRED EMBODIMENTS OF THE INVENTION

Preferred embodiments in accordance with the present invention will be described below referring to the accompanying drawings. The following descriptions are given to explain embodiments of the present invention. However, it is not construed that the present invention is limited to the following descriptions.

Figure 1:
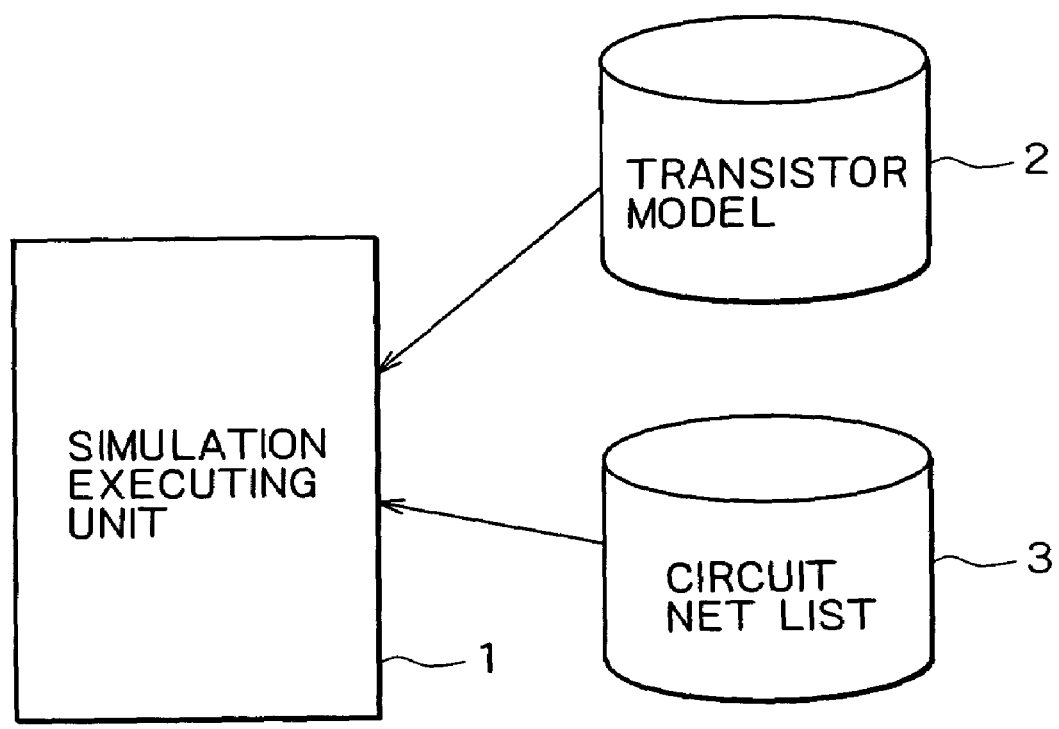
FIG. 1 is a block diagram showing the configuration of the conventional circuit simulation apparatus.
Figure 2A:
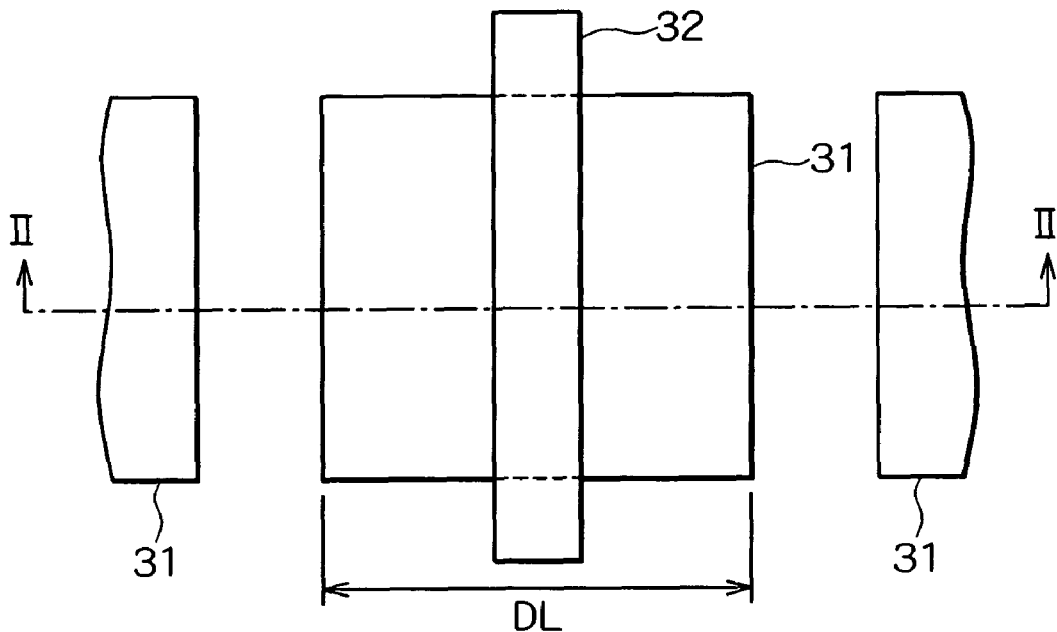
FIG. 2A is a plan view of an N-channel MOS transistor.
Figure 2B:
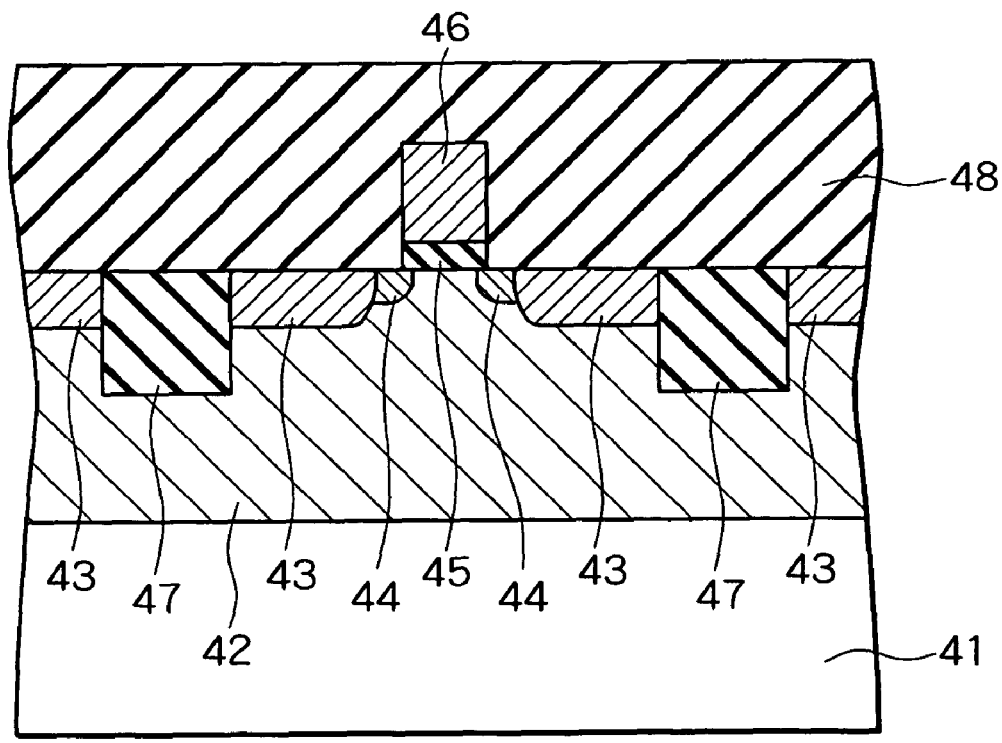
FIG. 2B is a sectional view taken along line II—II of FIG. 2A.
Figure 4:
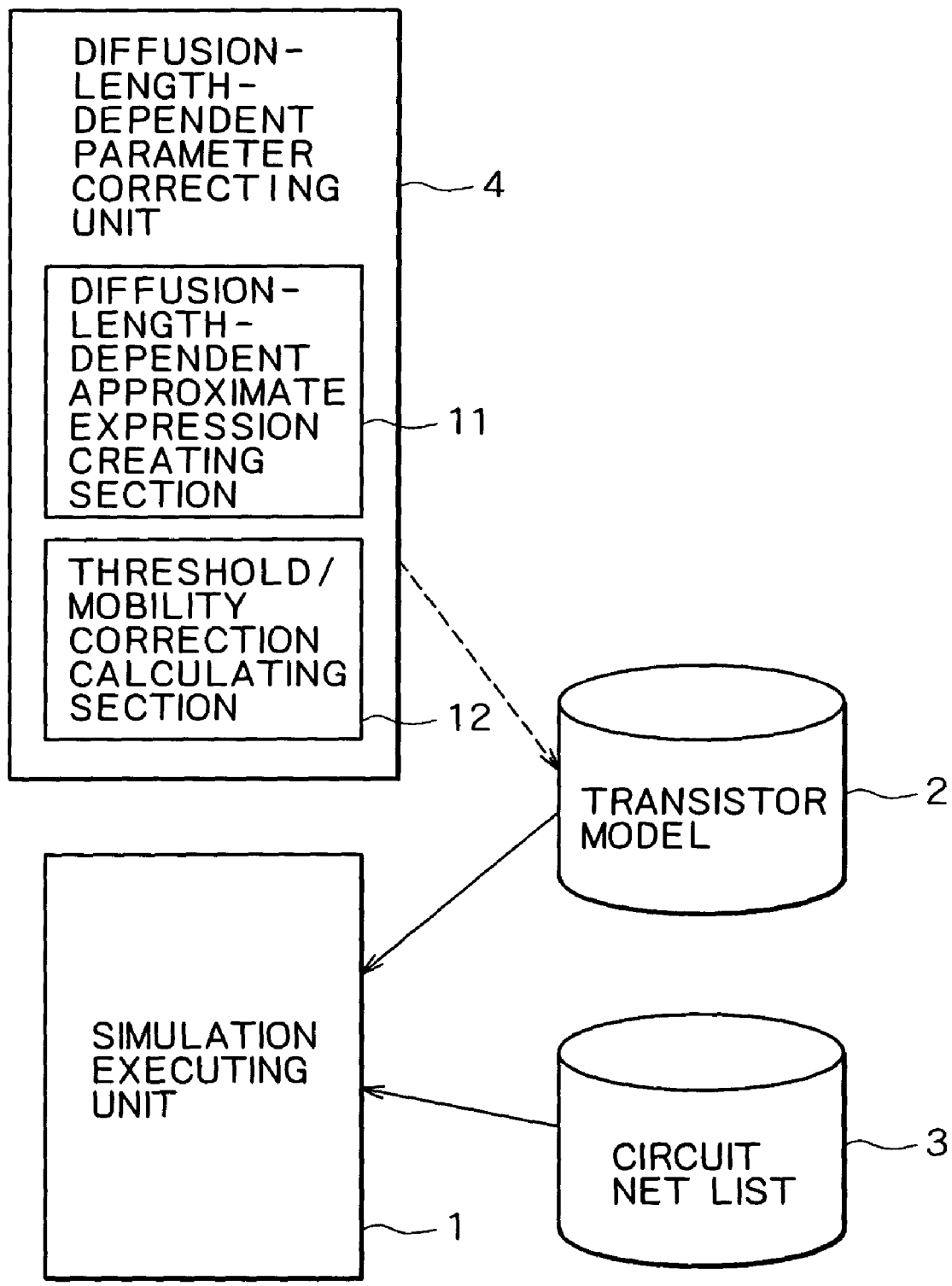
FIG. 4 is a block diagram showing the configuration of a circuit simulation apparatus in accordance with the present invention.

FIG. 4 is a block diagram showing the configuration of a circuit simulation apparatus in accordance with a first embodiment of the present invention. A simulation executing unit 1 is the main body of a circuit simulator typified by SPICE, just as in the case of the conventional circuit simulation apparatus shown in FIG. 1. It is in actuality a simulation executing program running on a computer. The simulation executing unit 1 reads a circuit net list 3 in which the connection descriptions of a circuit to be simulated are stored and calculates changes in the current and voltage of the circuit to be simulated, by referring to a transistor model 2 of MOS transistors, just as in the case of the conventional circuit simulation apparatus shown in FIG. 1. However, the circuit simulation apparatus shown in FIG. 4 is novel in that a diffusion-length-dependent parameter correcting unit 4 is provided in addition to the simulation executing unit 1, the transistor model 2 and the circuit net list 3.

From the data of diffusion-length-dependent parameters extracted from the parameters of the transistor model 2 of MOS transistors and from the parameters of transistors having various diffusion lengths, the diffusion-length-dependent parameter correcting unit 4 creates approximate expressions of the diffusion length dependence of these parameters, and calculates parameter correction values to be used instead of original parameter values by using the created approximate expressions. Hence, the correction values can be used easily instead of the original parameter values, whereby a MOS transistor model 2a (not shown in FIG. 4) having a different diffusion length DL can be created easily in a short time. The diffusion-length-dependent parameter correcting unit 4 has a diffusion-length-dependent approximate expression creating section 11 and a threshold/mobility correction calculating section 12.

The diffusion-length-dependent approximate expression creating section 11 creates an approximate expression of the diffusion length dependence of threshold voltage parameter VTH0 from the measurement result of the characteristics of a plurality of MOS transistors having different diffusion lengths DL, and also creates an approximate expression of the diffusion length dependence of mobility parameter U0 from the measurement result of the characteristics of a plurality of MOS transistors having different diffusion lengths DL. The threshold voltage parameter VTH0 and the mobility parameter U0 respectively correspond to the parameters VTH0 and U0 of the BSIM3 and BSIM4 transistor models.

The threshold/mobility correction calculating section 12 calculates the correction values of the threshold voltage parameter VTH0 and the mobility parameter U0 at a desired diffusion length DL of a transistor model on the basis of the approximate expressions created and stored by the diffusion-length-dependent approximate expression creating section 11.

The correction values of the threshold voltage parameter VTH0 and the mobility parameter U0 are returned to the transistor model 2, and the transistor model 2 is changed to the transistor model 2a (not shown), whereby a transistor model of MOS transistors, accurately corresponding to the drain current characteristics at the desired diffusion length DL, can be created easily in a short time.

FIG. 5 is a flowchart for a transistor model creating method in accordance with a second embodiment of the present invention. The flow has a first procedure including steps 21 and 22, a second procedure including steps 23 and 24, and a third procedure including steps 25 and 26. A transistor model creating method using the circuit simulation apparatus in accordance with the first embodiment shown in FIG. 4 will be described below in detail referring to FIG. 5.

The respective parameters of a MOS transistor model are usually extracted from data obtained by changing biases at the respective terminals of MOS transistors having various gate sizes and a fixed diffusion length DL=DL0, for example, using a parameter measurement/extraction apparatus not shown in FIG. 4. In FIG. 5, the characteristics of a transistor having a diffusion length DL=DL0 are measured at step 21. At step 22, various parameters are extracted and subjected to fitting, and a transistor model 2 capable of accurately reproducing the voltage/current characteristics of the MOS transistor having a diffusion length DL=DL0 is created.

Figure 6A:
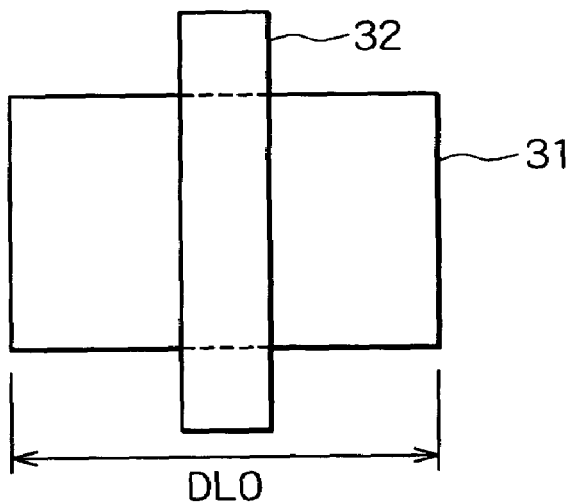
FIGS. 6A, 6B and 6C are plan views of MOS transistors having different diffusion lengths DL.
Figure 6B:
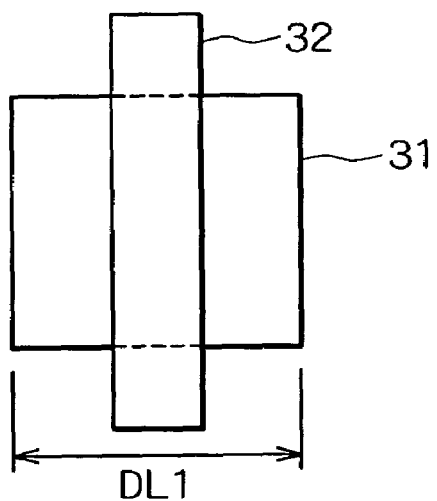
Figure 6C:
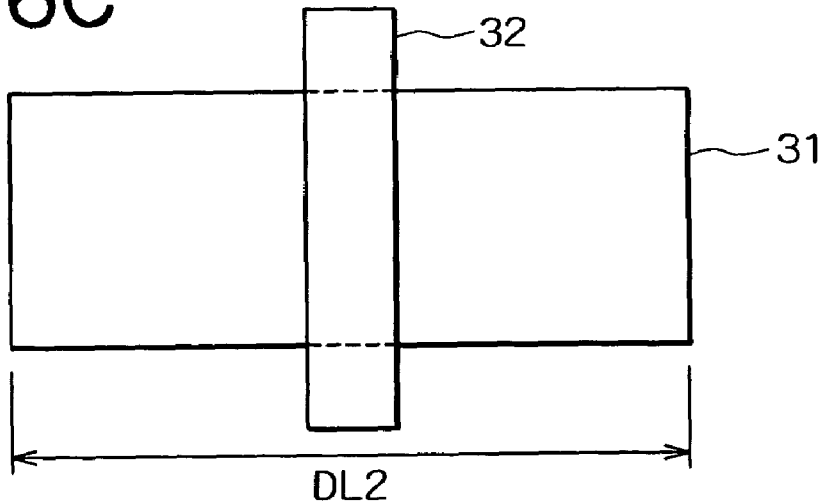

Next, at step 23, the drain currents and threshold voltages of MOS transistors having different diffusion lengths DL shown in FIGS. 6A to 6C are measured. FIG. 6A is a plan view of a MOS transistor that has a diffusion length DL=DL0 and is used for parameter extraction at steps 21 and 22. FIG. 6B is a plan view of a MOS transistor that has a diffusion length DL=DL1 smaller than DL0. FIG. 6C is a plan view of a MOS transistor that has a diffusion length DL=DL2 larger than DL0.

At step 24, the dependence of the threshold voltage parameter VTH0 and the dependence of the mobility parameter U0 on the diffusion length DL are obtained from the measurement result of the drain current and threshold voltage, and approximate expressions are created.

The reason why the mobility parameter U0 is selected as a parameter for representing the diffusion length dependence of drain current is based on the fact that the diffusion length dependence of drain current is found because the carrier mobility of a MOS transistor isolated by STI changes depending on the size of the diffusion layer thereof, as described in the above-mentioned document by Gregory Scott et al. In the MOS transistor isolated by STI, the STI portion increases in volume owing to heat treatment, whereby the diffusion layer region is deformed and crystal distortion occurs. Hence, the carrier mobility changes and the drain current also changes. In addition, together with the change in the carrier mobility, the change in the threshold voltage is also observed. Therefore, the inventors of the present invention have selected the threshold voltage parameter VTH0, significantly affecting the drain current, as a second parameter representing dependence on the diffusion length DL. Since it is observed that the threshold voltage depends on the diffusion length DL, there is a high probability that the change in drain current is caused not only by crystal distortion due to STI but also by other factors, such as a change in the doses of impurities during transistor production.

The changes in electrical characteristics are dependent on the diffusion length DL but rarely dependent on drain length or source length. In particular, in a transistor model of a SPICE simulator determined so as to be closely related to its physical origins, it is effective to introduce the dependence on the diffusion length DL to two parameters, the mobility parameter U0 and the threshold voltage parameter VTH0, and to create and store approximate expressions.

At step 24, in specific terms, two portions, that is, a portion wherein the mobility parameter U0 is proportional to an nth-degree polynomial (n: a positive integer) of (1/DL) and a portion wherein the threshold voltage parameter VTH0 changes in accordance with an mth-degree polynomial (m: a positive integer) of (1/DL), are obtained, and extraction is carried out so that the proportionality coefficients of the polynomials conform to actual measurements. The following expressions can be used.

$$U0(DL)=U0(DL=DL0)\times(ud0+ud1\times(1/DL)+ud2\times(1/DL)^2+ud3\times(1/DL)^3\ldots+udn\times(1/DL)^n)$$ (Expression 1)

$$VTH0(DL)=VTH0(DL=DL0)\times(vd0+vd1\times(1/DL)+vd2\times(1/DL)^2+vd3\times(1/DL)^3\ldots+vdm\times(1/DL)^m)$$ (Expression 2)

By making selection so that $(ud0+ud1\times(1/DL0)+ud2\times(1/DL0)^2+ud3\times(1/DL0)^3\ldots+udn\times(1/DL0)^n)=1$ in Expression 1 and so that $(vd0+vd1\times(1/DL0)+vd2\times(1/DL0)^2+vd3\times(1/DL0)^3\ldots+vdm\times(1/DL0)^m)=0$ in Expression 2, the accuracy in the range wherein DL is not equal to DL0 can be raised while the accuracy at DL=DL0 is maintained.

In the case when the diffusion length DL is very large, the distortion influence becomes weak, and the dependence on DL becomes small. Hence, by carrying out approximation using polynomials of (1/DL), better approximate expressions can be obtained.

In addition, an N-channel MOS transistor and a P-channel MOS transistor have dependence on distortion being different from each other. Furthermore, in terms of electrical characteristics, they also have dependence on the diffusion length DL being different from each other. However, the approximation using the polynomials of (1/DL) is effective for both of them, and the dependence on the diffusion length DL can be represented by the polynomials.

As described above, a polynomial, having coefficients ud0, ud1, ud2, ud3, . . . obtained at steps 23 and 24 of the second procedure, for approximating the dependence of the mobility parameter U0 on the diffusion length DL, and a polynomial, having coefficients vd0, vd1, vd2, vd3, . . . also obtained at steps 23 and 24 of the second procedure, for approximating the dependence of the threshold voltage parameter VTH0 on the diffusion length DL are presented at the time of simulation together with the MOS transistor model from which parameters are extracted by using a MOS transistor having DL=DL0 and obtained at steps 21 and 22 of the first procedure.

Figure 7A:
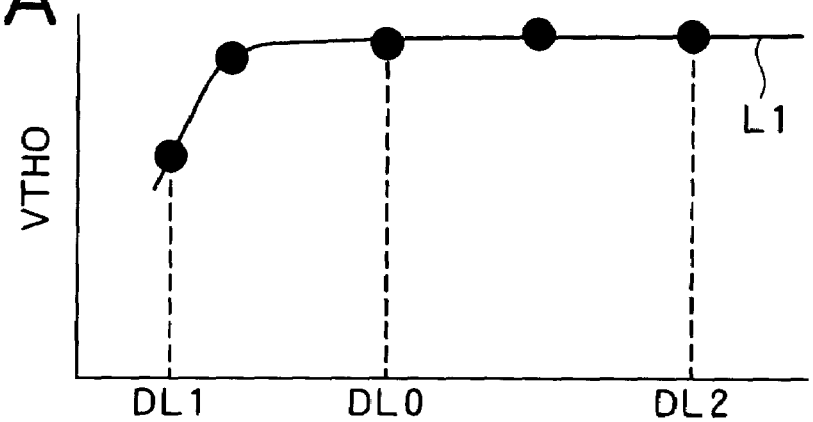
FIG. 7A is a graph wherein the measurement values of threshold voltage parameter VTH0 are compared with a curve L1 obtained by approximation using a polynomial.

FIG. 7A is a graph showing a relationship between the measurement values (black dots) of the threshold voltage parameter VTH0 in an N-channel MOS transistor and an approximate curve L1 obtained by approximation using a polynomial. By creating the approximate expression as described above, the threshold voltage parameter VTH0 corresponding to a desired diffusion length DL, such as DL=DL1 or DL=DL2, different from DL=DL0, can be obtained easily. Like the threshold voltage parameter VTH0 shown in FIG. 7A, the mobility parameter U0 corresponding to the desired diffusion length DL can also be obtained easily by creating an approximate expression.

Figure 3:
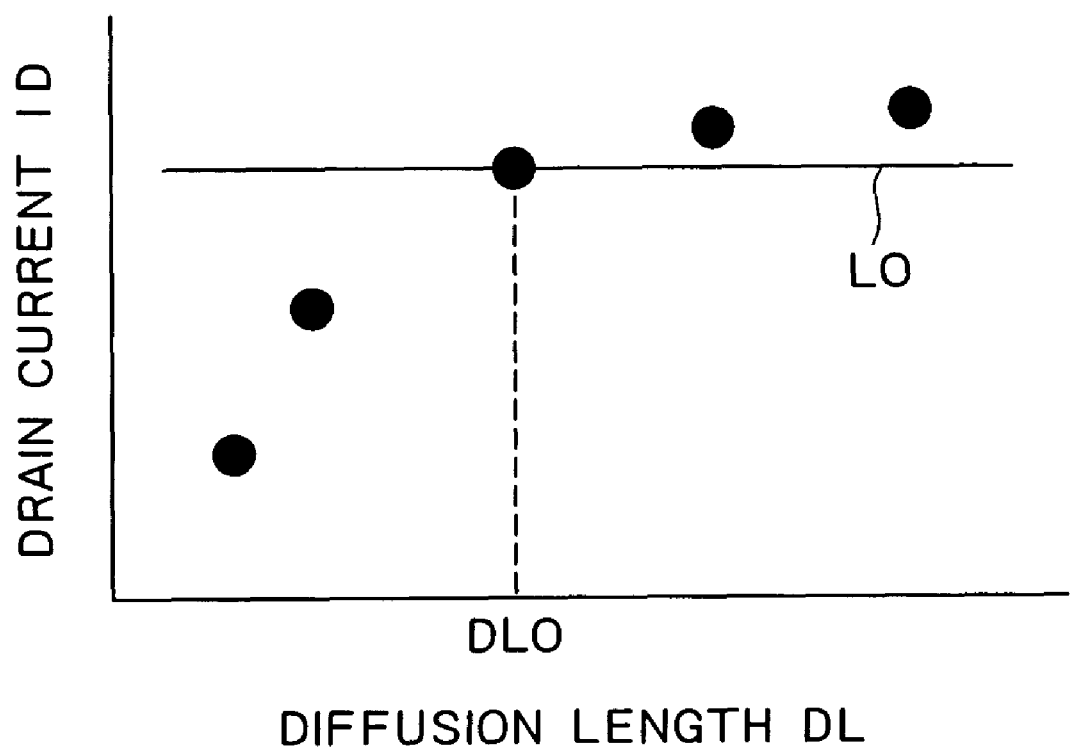
FIG. 3 is a graph illustrating that the dependence on diffusion length is not incorporated in the conventional circuit simulation.
Figure 7B:
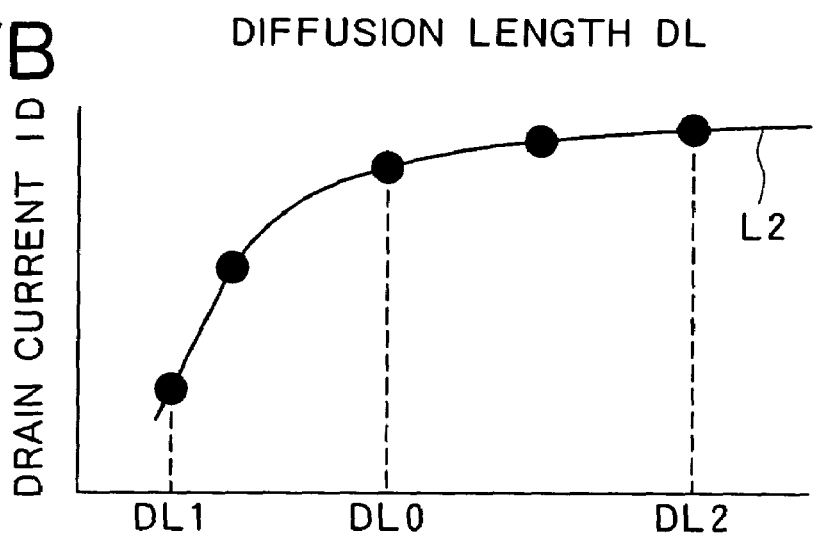
FIG. 7B is a graph wherein the measurement values of the dependence of drain current ID on diffusion length DL are compared with the calculated values thereof.

FIG. 7B is a graph example showing a comparison between the measurement values (black dots) of the dependence of the drain current ID of the N-channel MOS transistor on the diffusion length DL and a curve L2 representing the diffusion length dependence of the drain current calculated from a transistor model corrected for each diffusion length by applying the present invention and by using an approximate expression. Unlike the case of the conventional example shown in FIG. 3, by introducing the diffusion length dependence of the mobility parameter U0 and the threshold voltage parameter VTH0, the dependence of the drain current ID on the diffusion length DL can be represented properly as shown in FIG. 7B. A P-channel transistor isolated by STI shows dependence opposite to that of the N-channel MOS transistor, that is, the drain current increases as the diffusion length decreases. However, by introducing the diffusion length dependence of the mobility parameter U0 and the threshold voltage parameter VTH0, the dependence of the drain current on the diffusion length can be represented properly, just as in the case of the N-channel MOS transistor.

At step 25, the correction value of the mobility parameter U0 and the correction value of the threshold voltage parameter VTH0 at the diffusion length DL used in a circuit to be simulated are calculated by using the polynomial for approximating the dependence of the mobility parameter U0 on the diffusion length DL and by using the polynomial for approximating the dependence of the threshold voltage parameter VTH0 on the diffusion length DL, respectively.

At step 26, for the transistor model 2 extracted using the original MOS transistors having the DL=DL0, by changing the mobility parameter U0 and the threshold voltage parameter VTH0 by replacing the mobility parameter U0 with the correction value calculated from the corresponding approximate expression and by replacing the threshold voltage parameter VTH0 with the correction value calculated from the corresponding approximate expression, a circuit designer can create a MOS transistor model 2a conforming to a desired DL from the original transistor model 2, thereby being able to carry out highly accurate simulation. In addition, when the diffusion length DL is changed, the diffusion-length dependent parameters that must be changed by the circuit designer are only the mobility parameter U0 and the threshold voltage parameter VTH0. Hence, the diffusion length dependence can be incorporated into the transistor model by using fewer steps.

Although the flowchart shown in FIG. 5 indicates as if the first procedure including steps 21 and 22, the second procedure including steps 23 and 24, and the third procedure including steps 25 and 26 are executed sequentially. However, the first procedure and the second procedure are often executed independently of each other with respect to time. In some cases, the first procedure and the second procedure are executed almost concurrently, or a long lapse in time passes between the first procedure and the second procedure. Furthermore, the third procedure is also often executed independently of the first procedure and the second procedure with respect to time. There is a case wherein only the third procedure is repeated a plurality of times to carry out simulation by using a transistor model created at the first procedure and approximate expressions created at the second procedure and by using transistor models having different diffusion lengths.

It is explained that the circuit designer manually replace the parameter values of the original transistor model with the correction values calculated from the approximate expressions at step 26. However, in the case when a transistor model and the value of the diffusion length DL are designated, the present invention can be expanded to generate a transistor model corresponding to the designated diffusion length DL by automatically replacing the diffusion-length-dependent parameters (mobility parameter U0 and threshold voltage parameter VTH0) with correction values calculated from the approximate expressions.

In addition, in the above descriptions of the present invention, it is described that with respect to the diffusion length of a MOS transistor used for simulation, one kind of diffusion length is used in a simulation circuit. However, the present invention can be expanded as described below. By changing the format of circuit connection descriptions so that the diffusion length can be designated in circuit block units formed of a transistor or a plurality of transistors, a transistor model conforming to the diffusion length of each transistor or a diffusion length designated in circuit block units is formed and used for simulation.

Figure 7C:
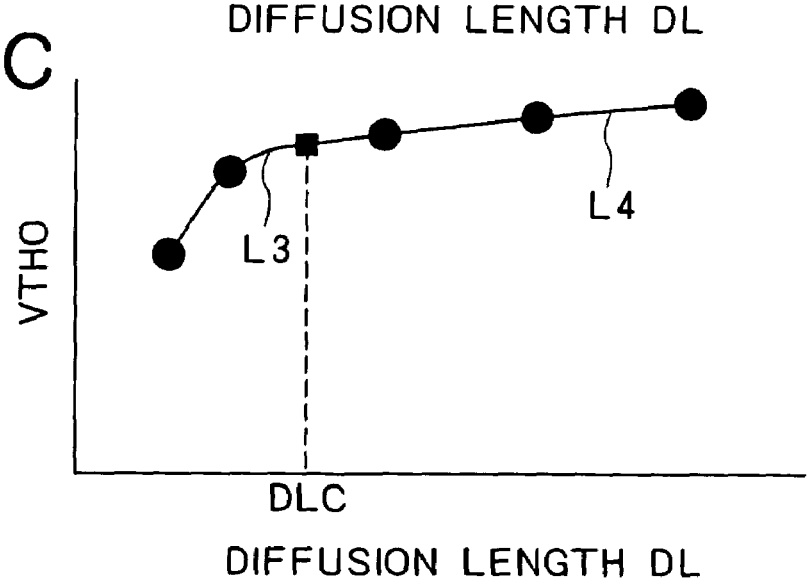
FIG. 7C is a graph showing an example wherein the range of the diffusion length values is divided into a range of diffusion length values not more than the critical value DLC thereof and a range of diffusion length values more than the critical value DLC and an approximate expression is set in each range.

Furthermore, in the case when the diffusion length dependence of the threshold voltage parameter VTH0 cannot be approximated with small errors by using one polynomial of (1/DL), it is possible to divide the range of the diffusion length values into a range of the diffusion length values not more than the approximate critical value DLC thereof and a range of the diffusion length values more than the approximate critical value DLC and to set an approximate expression in each range as shown in FIG. 7C. Still further, in the case of the diffusion length dependence of the mobility parameter U0, it is also similarly possible to divide the range of the diffusion length values into a range of the diffusion length values not more than the approximate critical value DLC thereof and a range of the diffusion length values more than the approximate critical value DLC and to set an approximate expression in each range. In FIG. 7C, an approximate curve L3 represented by the approximate expression for the range of the diffusion length values not more than the approximate critical value DLC and an approximate curve L4 represented by the approximate expression for the range of the diffusion length values more than the approximate critical value DLC are used to raise the accuracy of the approximation. Moreover, although a case wherein the range of the diffusion length values is divided into two ranges is shown in FIG. 7C, the range of the diffusion length values may be divided into three or more ranges and an approximate expression may be set for each range.

As described above, in the present invention, the approximate expression of a parameter having dependence on diffusion length is created on the basis of a transistor model, and the parameter value obtained by using the created approximate expression is used instead of the original value of the parameter, whereby a transistor model of MOS transistors having a different diffusion length DL is created. Hence, a transistor model of MOS transistors properly conforming to the drain current characteristics of a desired diffusion length DL can be created easily in a short time. Therefore, circuit simulation in consideration of the diffusion length dependence of the drain currents of MOS transistors can be carried out, whereby the accuracy of the simulation can be improved.

What is claimed is:

1. A circuit simulation apparatus comprising:
  a simulation executing unit which reads a circuit net list in which connection descriptions of a circuit to be simulated are stored, and which calculates changes in the current and voltage of said circuit to be simulated, using a transistor model, and
  a diffusion-length-dependent parameter correcting unit which creates an approximate expression for determining a corrected value of a diffusion-length-dependent parameter for a transistor model created for a transistor having a predetermined diffusion length, and which calculates and stores a corrected value of said diffusion-length-dependent parameter for said transistor model used by the simulation executing unit using said approximate expression to model a transistor having a diffusion length different from that of said transistor model,
  wherein said transistor includes a source region and a drain region, and an isolation region surrounds said source region and drain region, and
  wherein said diffusion length of said transistor is defined by a distance between boundaries of said isolation region in a direction from the source region to the drain region.

2. A circuit simulation apparatus according to claim 1, wherein said diffusion-length-dependent parameters include a threshold voltage parameter and a mobility parameter.

3. A circuit simulation apparatus according to claim 2, wherein the approximate expression of said threshold voltage parameter is a polynomial of a reciprocal of diffusion length.

4. A circuit simulation apparatus according to claim 2, wherein the approximate expression of said threshold voltage parameter includes a plurality of polynomials of the reciprocal of diffusion length, each of said plurality of polynomials applied to one of a plurality of diffusion length ranges obtained by dividing a range of diffusion length values by one or more predetermined approximate critical diffusion length values.

5. A circuit simulation apparatus according to claim 2, wherein the approximate expression of said mobility parameter is a polynomial of a reciprocal of diffusion length.

6. A circuit simulation apparatus according to claim 2, wherein the approximate expression of said mobility parameter includes a plurality of polynomials of the reciprocal of diffusion length, each of said plurality of polynomials applied to one of a plurality of diffusion length ranges obtained by dividing a range of diffusion length values by one or more predetermined approximate critical diffusion length values.

7. A transistor model creating method comprising the steps of:

creating a transistor model on the basis of the characteristics of a MOS transistor having a predetermined diffusion length, extracting diffusion-length-dependent parameters for each of a plurality of MOS transistors having diffusion lengths different from said predetermined diffusion length, creating approximate expressions representing a diffusion length dependence of said diffusion-length-dependent parameters for said plurality of MOS transistors, calculating corrected values of said diffusion-length-dependent parameters for a transistor having a diffusion length different than said predetermined diffusion length, using one or more of said approximate expressions, and creating and storing a corrected transistor model using said corrected values of said diffusion-length-dependent parameters, wherein said transistor includes a source region and a drain region, and an isolation region surrounds said source region and drain region, and wherein said diffusion length of said transistor is defined by a distance between boundaries of said isolation region in a direction from the source region to the drain region.

8. A transistor model creating method according to claim 7, wherein said diffusion-length-dependent parameters includes a threshold voltage parameter and a mobility parameter.

9. A transistor model creating method according to claim 8, wherein the approximate expression of said threshold voltage parameter is a polynomial of a reciprocal of diffusion length.

10. A transistor model creating method according to claim 8, wherein the approximate expression of said threshold voltage parameter includes a plurality of polynomials of a reciprocal of diffusion length, each of said plurality of polynomials applied to one of a plurality of diffusion length ranges obtained by dividing a range of diffusion length values by one or more predetermined approximate critical diffusion length values.

11. A transistor model creating method according to claim 8, wherein the approximate expression of said mobility parameter is a polynomial of a reciprocal of diffusion length.

12. A transistor model creating method according to claim 8, wherein the approximate expression of said mobility parameter includes a plurality of polynomials of a reciprocal of diffusion length, each of said plurality of polynomials applied to one of a plurality of diffusion length ranges obtained by dividing a range of diffusion length values by one or more predetermined approximate critical diffusion length values.

* * * * *

UNITED STATES PATENT AND TRADEMARK OFFICE
CERTIFICATE OF CORRECTION

PATENT NO.       : 7,222,060 B2                                   Page 1 of 1
APPLICATION NO. : 10/668974
DATED            : May 22, 2007
INVENTOR(S)      : Takashi Shimizu and Hironori Sakamoto It is certified that error appears in the above-identified patent and that said Letters Patent is hereby corrected as shown below:

Column 2, at line 52, delete "creating" and replace with -- create --

In claim 8, column 10, at line 13, delete "includes" and replace with -- include --

Signed and Sealed this

Thirteenth Day of November, 2007

JON W. DUDAS
*Director of the United States Patent and Trademark Office*